United States Patent
Cooper et al.

(10) Patent No.: US 9,678,430 B2
(45) Date of Patent: Jun. 13, 2017

(54) COMPOSITION AND PROCESS FOR STRIPPING PHOTORESIST FROM A SURFACE INCLUDING TITANIUM NITRIDE

(71) Applicant: ADVANCED TECHNOLOGY MATERIALS, INC., Danbury, CT (US)

(72) Inventors: Emanuel I. Cooper, Scarsdale, NY (US); Marc Conner, Danbury, CT (US); Michael Owens, Danbury, CT (US)

(73) Assignee: Entegris, Inc., Billerica, MA (US)

( * ) Notice: Subject to any disclaimer, the term of this patent is extended or adjusted under 35 U.S.C. 154(b) by 11 days.

(21) Appl. No.: 14/401,732

(22) PCT Filed: May 17, 2013

(86) PCT No.: PCT/US2013/041629
§ 371 (c)(1),
(2) Date: Nov. 17, 2014

(87) PCT Pub. No.: WO2013/173738
PCT Pub. Date: Nov. 21, 2013

(65) Prior Publication Data
US 2015/0168843 A1   Jun. 18, 2015

Related U.S. Application Data

(60) Provisional application No. 61/648,951, filed on May 18, 2012.

(51) Int. Cl.
*C11D 7/08* (2006.01)
*G03F 7/42* (2006.01)
(Continued)

(52) U.S. Cl.
CPC ............. *G03F 7/423* (2013.01); *C11D 3/042* (2013.01); *C11D 3/364* (2013.01); *H01L 21/31133* (2013.01)

(58) Field of Classification Search
CPC .................................................. C11D 11/0047
See application file for complete search history.

(56) References Cited

U.S. PATENT DOCUMENTS 4,169,068 A   9/1979 Harita et al.
4,885,106 A   12/1989 Lapham et al.
(Continued)

FOREIGN PATENT DOCUMENTS

EP   0276774 A2   1/1988
EP   0346667 A1   5/1989
(Continued)

OTHER PUBLICATIONS

International Search Report, Aug. 21, 2013.
Supplemental European Search Report, Dec. 8, 2015.

*Primary Examiner* — Gregory Webb
(74) *Attorney, Agent, or Firm* — Entegris, Inc. Legal Dept.; Nidhi G. Kissoon

(57) ABSTRACT

A method and low pH compositions for removing bulk and/or hardened photoresist material from microelectronic devices have been developed. The low pH compositions include sulfuric acid and at least one phosphorus-containing acid. The low pH compositions effectively remove the hardened photoresist material while not damaging the underlying silicon-containing layer(s) or the metal gate materials.

19 Claims, 1 Drawing Sheet

(51) Int. Cl.
*H01L 21/311* (2006.01)
*C11D 3/04* (2006.01)
*C11D 3/36* (2006.01)

(56) References Cited

U.S. PATENT DOCUMENTS

| | | | |
|---|---|---|---|
| 4,963,342 A | 10/1990 | Lapham et al. | |
| 5,037,724 A * | 8/1991 | Maeda | G03F 7/423 134/2 |
| 5,166,039 A * | 11/1992 | Maeda | G03F 7/423 134/2 |
| 5,320,709 A | 6/1994 | Bowden et al. | |
| 6,194,366 B1 | 2/2001 | Naghshineh et al. | |
| 6,211,126 B1 | 4/2001 | Wojtczak et al. | |
| 6,244,785 B1 | 6/2001 | Richter et al. | |
| 6,280,651 B1 | 8/2001 | Wojtczak et al. | |
| 6,306,807 B1 | 10/2001 | Wojtczak et al. | |
| 6,323,168 B1 | 11/2001 | Kloffenstein et al. | |
| 6,344,432 B1 | 2/2002 | Wojtczak et al. | |
| 6,492,308 B1 | 12/2002 | Naghshineh et al. | |
| 6,566,315 B2 | 5/2003 | Wojtczak et al. | |
| 6,599,370 B2 | 7/2003 | Skee | |
| 6,627,587 B2 | 9/2003 | Naghshineh et al. | |
| 6,723,691 B2 | 4/2004 | Naghshineh et al. | |
| 6,755,989 B2 | 6/2004 | Wojtczak et al. | |
| 6,773,873 B2 | 8/2004 | Seijo et al. | |
| 6,815,150 B2 | 11/2004 | Nakahara et al. | |
| 6,849,200 B2 | 2/2005 | Baum et al. | |
| 6,875,733 B1 | 4/2005 | Wojtczak et al. | |
| 6,896,826 B2 | 5/2005 | Wojtczak et al. | |
| 7,365,045 B2 | 4/2008 | Walker et al. | |
| 7,399,365 B2 * | 7/2008 | Aoyama | C11D 7/08 134/2 |
| 7,521,406 B2 * | 4/2009 | Hsu | G03F 7/423 134/1.3 |
| 7,534,752 B2 | 5/2009 | Wojtczak et al. | |
| 7,736,405 B2 | 6/2010 | Darsillo et al. | |
| 7,888,301 B2 | 2/2011 | Bernhard et al. | |
| 7,922,824 B2 | 4/2011 | Minsek et al. | |
| 7,923,423 B2 | 4/2011 | Walker et al. | |
| 7,960,328 B2 | 6/2011 | Visintin et al. | |
| 7,994,108 B2 | 8/2011 | Minsek et al. | |
| 8,026,200 B2 | 9/2011 | Cooper et al. | |
| 8,044,009 B2 * | 10/2011 | Kane | C11D 3/3947 134/1.3 |
| 8,058,219 B2 | 11/2011 | Rath et al. | |
| 8,236,485 B2 | 8/2012 | Minsek et al. | |
| 8,338,087 B2 | 12/2012 | Rath et al. | |
| 8,497,233 B2 * | 7/2013 | Westwood | C11D 3/0073 510/175 |
| 8,685,909 B2 | 4/2014 | Angst et al. | |
| 8,754,021 B2 | 6/2014 | Barnes et al. | |
| 8,778,210 B2 | 7/2014 | Cooper et al. | |
| 2005/0014667 A1 * | 1/2005 | Aoyama | C11D 7/08 510/175 |
| 2005/0145311 A1 | 7/2005 | Walker et al. | |
| 2005/0176603 A1 * | 8/2005 | Hsu | G03F 7/423 510/175 |
| 2005/0245409 A1 * | 11/2005 | Cernat | C11D 7/08 510/175 |
| 2006/0063687 A1 | 3/2006 | Minsek et al. | |
| 2006/0148666 A1 | 7/2006 | Peters et al. | |
| 2007/0251551 A1 | 11/2007 | Korzenski et al. | |
| 2008/0076688 A1 | 3/2008 | Barnes et al. | |
| 2008/0125342 A1 | 5/2008 | Visintin et al. | |
| 2008/0171682 A1 * | 7/2008 | Kane | C11D 3/3947 510/176 |
| 2008/0210900 A1 * | 9/2008 | Wojtczak | H01L 21/31111 252/79.3 |
| 2008/0242574 A1 | 10/2008 | Rath et al. | |
| 2008/0269096 A1 | 10/2008 | Visintin et al. | |
| 2009/0032766 A1 | 2/2009 | Rajaratnam et al. | |
| 2009/0099051 A1 * | 4/2009 | Aoyama | C11D 7/08 510/176 |
| 2009/0212021 A1 | 8/2009 | Bernhard et al. | |
| 2009/0281016 A1 | 11/2009 | Cooper et al. | |
| 2010/0043823 A1 * | 2/2010 | Lee | C11D 7/3263 134/1.3 |
| 2010/0056410 A1 | 3/2010 | Visintin et al. | |
| 2010/0065530 A1 | 3/2010 | Walker et al. | |
| 2010/0105595 A1 * | 4/2010 | Lee | C09G 1/02 510/176 |
| 2010/0112728 A1 * | 5/2010 | Korzenski | H01L 21/02079 438/3 |
| 2010/0163788 A1 | 7/2010 | Visintin et al. | |
| 2010/0261632 A1 | 10/2010 | Korzenski et al. | |
| 2010/0286014 A1 | 11/2010 | Barnes | |
| 2010/0326477 A1 | 12/2010 | DeKraker et al. | |
| 2011/0039747 A1 | 2/2011 | Zhou et al. | |
| 2011/0117751 A1 | 5/2011 | Sonthalia et al. | |
| 2011/0281436 A1 * | 11/2011 | Inaba | C11D 7/265 438/710 |
| 2012/0015857 A1 | 1/2012 | Chen et al. | |
| 2012/0028871 A1 * | 2/2012 | Westwood | C11D 3/0073 510/176 |
| 2012/0283163 A1 | 11/2012 | Barnes et al. | |
| 2013/0203643 A1 | 8/2013 | Nakanishi et al. | |
| 2013/0270217 A1 | 10/2013 | Yoshida et al. | |
| 2013/0280123 A1 | 10/2013 | Chen et al. | |
| 2013/0296214 A1 | 11/2013 | Barnes et al. | |
| 2013/0303420 A1 | 11/2013 | Cooper et al. | |
| 2014/0038420 A1 | 2/2014 | Chen et al. | |
| 2014/0238953 A1 | 8/2014 | Kojima et al. | |
| 2014/0318584 A1 | 10/2014 | Cooper et al. | |
| 2015/0045277 A1 | 2/2015 | Liu et al. | |

FOREIGN PATENT DOCUMENTS

| | | |
|---|---|---|
| EP | 2592131 A2 | 5/2013 |
| JP | 2012036750 A | 2/2012 |
| JP | 2012062572 A | 3/2012 |
| JP | 2012186470 A | 9/2012 |
| JP | 2012251026 A | 12/2012 |
| WO | 2006110645 A2 | 10/2006 |
| WO | 2007027522 A2 | 3/2007 |
| WO | 2008157345 A2 | 12/2008 |
| WO | 2009135102 A2 | 11/2009 |
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2010099017 A2 | 9/2010 |
| WO | 2011072188 A2 | 6/2011 |
| WO | 2012051380 A2 | 4/2012 |
| WO | 2012174518 A2 | 12/2012 |
| WO | 2013101907 A1 | 7/2013 |
| WO | 2013138276 A1 | 9/2013 |
| WO | 2013138278 A1 | 9/2013 |
| WO | 2013170130 A1 | 11/2013 |
| WO | 2013173738 A1 | 11/2013 |
| WO | 2014089196 A1 | 6/2014 |

* cited by examiner

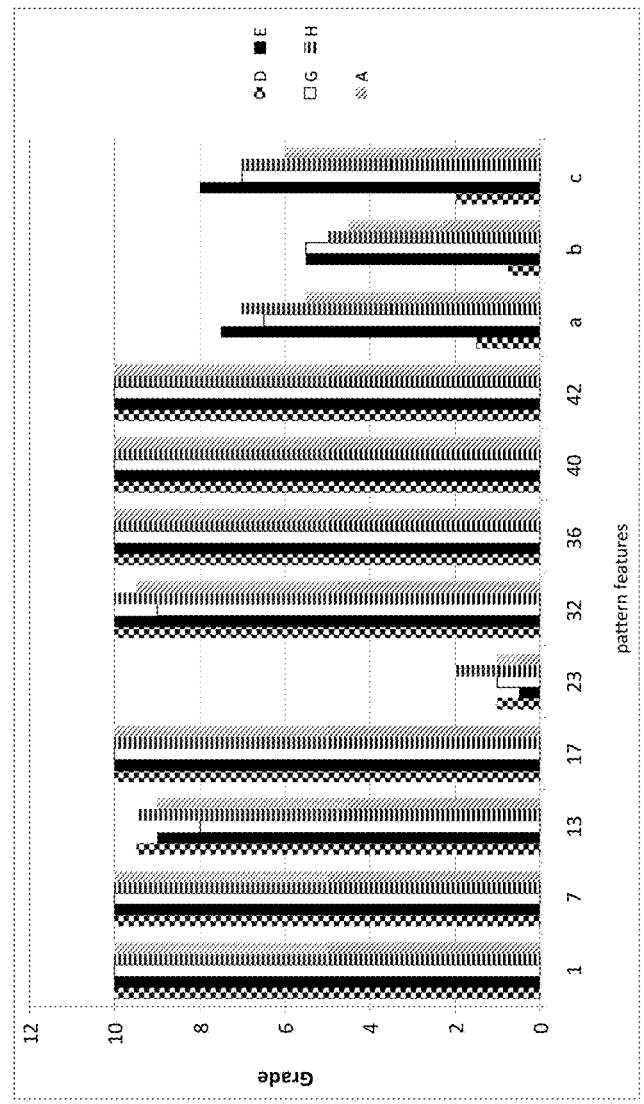

COMPOSITION AND PROCESS FOR STRIPPING PHOTORESIST FROM A SURFACE INCLUDING TITANIUM NITRIDE

CROSS-REFERENCE TO RELATED APPLICATIONS

This application is filed under the provisions of 35 U.S.C. §371 and claims the priority of International Patent Application No. PCT/US2013/041629 filed on 17 May 2013 entitled "COMPOSITION AND PROCESS FOR STRIPPING PHOTORESIST FROM A SURFACE INCLUDING TITANIUM NITRIDE" in the name of Emanuel I. COOPER, et al., which claims priority to U.S. Provisional Patent Application No. 61/648,951 filed on 18 Mar. 2012, both of which are hereby incorporated by reference herein in their entirety.

FIELD

The present invention relates generally to a composition and process of removing resist, specifically high dose implanted resist, from a microelectronic device comprising same. The composition and method as disclosed selectively removes said resist relative to titanium nitride.

DESCRIPTION OF THE RELATED ART

Resist, including photoresist, is a radiation sensitive (e.g., light radiation sensitive) material used to form a patterned layer on a substrate (e.g., a semiconductor wafer) during semiconductor device fabrication. After exposing a portion of a resist coated substrate to radiation, either the exposed portion of the resist (for positive resist), or the unexposed portion of the resist (for negative resist) is removed to reveal the underlying surface of the substrate, leaving the rest of the surface of the substrate coated and protected by resist. Resist may be more generally referred to as a masking material. Other fabrication processes such as ion-implanting, etching, or depositing may be performed on the uncovered surface of the substrate and the remaining resist. After performing the other fabrication processes, the remaining resist is removed in a strip operation.

In ion-implantation, dopant ions (e.g., ions of boron, boron difluoride, arsenic, indium, gallium, phosphorous, germanium, antimony, xenon or bismuth) are accelerated toward a substrate to be implanted. The ions are implanted in the exposed regions of the substrate as well as in the remaining resist. Ion-implantation may be used, for example, to form implanted regions in the substrate such as the channel region and source and drain regions of transistors. Ion-implantation may also be used to form lightly doped drain and double diffused drain regions. However, high-dose ions implanted in the resist may deplete hydrogen from the surface of the resist causing the resist to form an outer layer or crust, which may be a carbonized layer that is harder than the underlying portion of the resist layer (i.e., the bulk portion of the resist layer). The outer layer and the bulk portion have different thermal expansion rates and react to stripping processes at different rates.

One type of transistor is known as a field-effect-transistor (FET). An FET may also be known as a metal-oxide-semiconductor FET (MOSFET), although MOSFET is a misnomer for FETs having a silicon gate instead of a metal gate. FET transistors comprise a source region, a drain region, a channel region between the source and drain regions, a gate insulator above the channel region and a gate electrode above the gate insulator. In early FETs from very early technologies, gate electrodes typically comprised metal. In later technologies, gate electrodes typically comprised semiconductor silicon (e.g., in the form of polysilicon). Silicon was used because silicon is compatible with silicon dioxide used as the gate insulator, and because silicon could tolerate high temperatures that were useful for fabricating FETs and integrated circuits that included FETs. However, some very recent technologies are again using metal gate electrodes. Metal has the advantage of having less electrical resistance than polysilicon, thus reducing signal propagation times. Furthermore, in very recent technologies having transistor dimensions that are smaller that dimensions of preceding technologies, it is necessary to make the gate dielectric layer very thin (e.g., one nanometer). Very thin gate dielectric layers may cause a problem in polysilicon gate electrodes, called poly depletion, where a depletion layer is formed in the gate polysilicon electrode next to the gate dielectric when the channel region of the transistor is in inversion. To avoid poly depletion, a metal gate is desired. A variety of metal gates materials may be used, usually in conjunction with relatively high dielectric constant gate insulator materials, known as high-k dielectrics. Examples of metal gate materials include tantalum, tungsten, tantalum nitride, and titanium nitride (TiN).

An important aspect of resist stripping concerns damage to the substrate, or undesirable removal of a portion of the substrate, that may result from resist stripping. Such damage is undesirable because it may cause structures and devices formed in or on the substrate (e.g., transistors or other electronic devices formed in or on a semiconductor wafer or silicon wafer) not to function or to function poorly. Examples of damage to or removal of substrate material include, but are not limited to, damage to or removal of silicon or titanium nitride (TiN), for example, TiN comprised in a metal gate of an FET or TiN comprised in a barrier between a semiconductor and a metal. The damage may involve dissolution (etching), conversion to different solid phases such as oxides, or a combination of both. For example, it is known that sulfuric acid is effective at removing high dose implanted resist, however, it can be quite aggressive towards TiN. Disadvantageously, typical surface-active reagents don't work well as inhibitors in sulfuric acid because of very poor solubility and/or protonation by the very strong acid.

Accordingly, the need for a composition that strips high dose implanted resist while not substantially damaging other materials on the substrate continues to exist. Most preferably, the high dose implanted resist stripping composition effectively and efficiently removes the resist while not substantially damaging metal gate materials such as TiN.

BRIEF DESCRIPTION OF THE DRAWINGS

The FIGURE illustrates the removal effectiveness of compositions A, D, E, G, and H at removing photoresist from various locations on the surface, graded on a scale from 1 to 10.

SUMMARY

The present invention relates generally to a composition and method of removing resist, specifically high dose implanted resist, from a microelectronic device comprising same. The composition and method as disclosed effectively removes said resist while not substantially damaging other materials present on the device surface, such as titanium nitride.

In one aspect, a composition for stripping resist is described, said composition comprising sulfuric acid and at least one phosphorus-containing acid, with the proviso that the phosphorus-containing acid cannot include phosphoric acid per se.

In another aspect, a composition for stripping resist is described, said composition comprising sulfuric acid and at least one phosphonic acid or phosphonic acid derivative.

In still another aspect, a method of removing high dose ion-implanted resist from the surface of a microelectronic device comprising same, said method comprising contacting the microelectronic device with a composition for time and temperature necessary to effectuate at least partial removal of the resist, wherein said composition comprises sulfuric acid and at least one phosphorus-containing acid, with the proviso that the phosphorus-containing acid cannot include phosphoric acid per se.

In yet another aspect, a method of removing high dose ion-implanted resist from the surface of a microelectronic device comprising same, said method comprising contacting the microelectronic device with a composition for time and temperature necessary to effectuate at least partial removal of the resist, wherein said composition comprises sulfuric acid and at least one phosphonic acid or phosphonic acid derivative.

In another aspect, a method of removing high dose ion-implanted resist from the surface of a microelectronic device comprising same is described, said method comprising:

contacting the microelectronic device with a first composition for time and temperature necessary to effectuate at least partial removal of the resist, wherein the first composition comprises sulfuric acid and at least one phosphorus-containing acid, with the proviso that the phosphorus-containing acid cannot include phosphoric acid per se;

contacting the microelectronic device with a cerium-containing composition to effectuate additional removal of the resist; and optionally contacting the microelectronic device with the first composition to complete the substantial remove the resist from the device.

Other aspects, features and advantages of the invention will be more fully apparent from the ensuing disclosure and appended claims.

DETAILED DESCRIPTION AND PREFERRED EMBODIMENTS THEREOF

The present invention relates generally to a composition and method of removing resist, specifically high dose implanted resist, from a microelectronic device comprising same. The composition and method as disclosed effectively removes said resist while not substantially damaging other materials present on the device surface, such as metal gate materials.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device material" are not meant to be limiting in any way and include any substrate or structure that will eventually become a microelectronic device or microelectronic assembly.

"Ion-implantation" is a process by which ions of a dopant material can be implanted into target material, usually a solid. Ion-implantation is used in semiconductor device fabrication, for example, in the fabrication of integrated circuits and silicon semiconductor devices. The implanted ions may introduce or cause a chemical change in the target due to the ions being a different element than the target, and/or a structural change, in that the target may be modified, damaged or even destroyed by ion-implantation. By way of example only, elements that are typically used for implanted species in semiconductor fabrication include boron, boron difluoride, arsenic, indium, gallium, germanium, bismuth, xenon, phosphorus and antimony. Boron is a p-type dopant in silicon because it donates or causes a "hole" (i.e., electron vacancy) in the silicon. Arsenic is an n-type dopant in silicon because it donates or causes an extra electron in the silicon. Dopants, such as boron and arsenic, implanted in intrinsic silicon, may cause the intrinsic silicon to become conductive as a semiconductor. One or more dopant materials may be implanted into a target material.

Ion-implantation is usually characterized by dose and energy. The dose is the number of ions that are implanted per area of target material. The energy is the energy of the ions being implanted. More advanced semiconductor processing or fabrication technologies typically use higher dose and/or higher energy than older technologies. In "high dose ion-implantation" (HDII), the ion dose may be greater than about $5\times10^{14}$ ions/cm$^2$ and/or the average energy of the ions, before the ions impact the target or substrate, may be from about five thousand electron volts (KeV) to greater than 100 KeV.

"Resist" including "photoresist" is a radiation sensitive material that is used to form a patterned coating on a surface, for example, the surface of a substrate or target. Resists are used in the fabrication of semiconductor devices, for example, integrated circuits and silicon semiconductor devices. One use of resists in the fabrication of semiconductor devices is as a mask for selective ion-implantation of dopants into a semiconductor substrate. A layer of resist is applied to the surface of the semiconductor substrate, or to the surface of a layer on or within the substrate, such as an insulator layer above a semiconductor layer. A portion of the resist is exposed to the radiation, such portion of the resist corresponding to either the area of the semiconductor to be implanted (positive resist) or to the area of the semiconductor not to be implanted (negative resist). The resist is then exposed to a developer which assists in removing a portion of the resist so that only the desired portion of the resist remains. "Positive resist" is a type of resist in which the portion of the resist that is exposed to the radiation becomes soluble to, and removed by, the resist developer. The portion of the resist that is unexposed remains insoluble to, and is not removed by, the resist developer. "Negative resist" is a type of resist in which the portion of the resist that is exposed to the radiation becomes insoluble to, and not removed by, the photoresist developer. The portion of the resist that is not exposed to radiation remains soluble to, and is removed by, the resist developer. The soluble portion of resist is dissolved by the resist developer. Ion-implantation occurs after the resist is patterned by exposure to the radiation and developed by the developer. The remaining portion of the resist blocks the implanted ions from reaching the semiconductor, or other material, below the resist. The ions blocked by the resist are implanted into the resist instead of the underlying substrate. The portions of the semiconductor not covered by resist are ion-implanted.

The radiation to which various resists are sensitive encompasses a relatively broad range. By way of example only, the radiation may be within ultraviolet light (e.g., about 300 to 400 nm (nanometers)), deep ultra violet light (DUV; e.g., about 10 to 300 nm), G, H and I lines of mercury-vapor lamps (approximately 436 nm, 404.7 nm and 365.4 nm respectively), and x-rays (e.g., approximately 0.01 to 10 nm). The radiation may alternately comprise electron beam (e-beam) radiation. DUV light comprising a wavelength of approximately 193 nm and light comprising a wavelength of approximately 248 nm are often used for the radiation. The photolithographic technologies comprising radiations of approximately 193 and 248 nm are called 193 nm lithography and 248 nm lithography, respectively.

Because of the relatively high dose and/or high energy of the implanted ions blocked by the resist, the resist forms a crust or hard shell on the outer portions or outer sides of the resist where the ions impact and are absorbed. The resist hardening may result from, or be referred to as, carbonization, polymerizing or polymer cross-linking. Specifically, the ions penetrating into the outer regions of the resist may cause the outer regions of the resist (e.g., top and sides of the resist) to become a crust, and chemical bonds in the inner regions of the resist close to the outer regions to become cross-linked. The crust is known to be difficult to remove during a resist stripping process (e.g., the crust is insoluble in some known solvents used for stripping). Because the ions only penetrate a limited distance into the resist material, the crust is formed mostly on the outer portions of the resist. Because the bottom of the resist is covered by the implanted material or substrate, the crust may form on the top and side surfaces of the resist, but not on the bottom portion or in the interior portion of the resist. For typical resist, the top crust is thicker than the side crust because the ions are usually implanted primarily with a downward direction of incidence. The thickness of the resist crust is dependent upon the dosage of the implanted ions and the ion-implant energy. The resist material that is inside or beneath the crust, that is, the portion of the resist that is generally unaffected by the ions, is referred to as bulk resist or bulk resist material. The hardening or crusting of the resist, for example, renders the outer portion of the resist insoluble, or less soluble, in water or in some other aqueous solutions (although, not necessarily in all other aqueous solutions or in all organic solvents).

"High dose ion-implantation strip" (HDIS) is the process of stripping exposed resist that has received HDII. Some HDIS processes may include dry processes, such as plasma processes and vacuum processes, or wet chemical processes.

The meaning of "metal gate" or "metal gate electrode," as used herein, includes gate electrodes of transistors (e.g., FET) comprising metal. The metal may be in combination with other material. Metals in the metal gates include, but are not limited to, Ti, Ta, W, Mo, Ru, Al, La, titanium nitride, tantalum nitride, tantalum carbide, titanium carbide, molybdenum nitride, tungsten nitride, ruthenium (IV) oxide, tantalum silicon nitride, titanium silicon nitride, tantalum carbon nitride, titanium carbon nitride, titanium aluminide, tantalum aluminide, titanium aluminum nitride, tantalum aluminum nitride, lanthanum oxide, or combinations thereof. One specific example of a metal gate comprises titanium nitride (TiN). It is noted that TiN has other uses in electronic devices, for example, as a barrier metal between silicon and metal contacts and as an electric conductor. It should be appreciated that the compounds disclosed as metal gate materials may have varying stoichiometries. Accordingly, titanium nitride will be represented as $TiN_x$ herein, tantalum nitride will be represented as $TaN_x$ herein, and so on.

"Silicon" may be defined to include, Si, polycrystalline Si, monocrystalline Si, and SiGe as well as other silicon-containing materials such as silicon oxide, thermal oxide, SiOH and SiCOH. Silicon is comprised in silicon-on-insulator (SOI) wafers that may be used, for example, as substrates or part of a substrate for electronic devices such as FETs and integrated circuits. Other types of wafers may also comprise silicon.

As used herein, "underlying silicon-containing" layer corresponds to the layer(s) immediately below the bulk and/or the hardened photoresist including: silicon; silicon oxide, including gate oxides (e.g., thermally or chemically grown $SiO_2$) and TEOS; silicon nitride; and low-k dielectric materials. As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As defined herein, "substantially devoid" corresponds to less than about 2 wt. %, more preferably less than 1 wt. %, and most preferably less than 0.1 wt. % of the composition, based on the total weight of said composition.

As used herein, "fluoride" species correspond to species including an ionic fluoride ($F^-$) or covalently bonded fluorine. It is to be appreciated that the fluoride species may be included as a fluoride species or generated in situ.

Four important aspects of resist stripping are: (i) stripping at relatively low temperatures; (ii) relatively short times for resist stripping to allow for acceptable wafer throughput; (iii) substantially complete removal of resist from the microelectronic device surface; and (iv) minimizing or substantially eliminating the damage to, or undesirable removal of, other materials (e.g., silicon, metal gates, or both) from the microelectronic device surface that may result from resist stripping. Examples of damage to or removal of materials include, but are not limited to, damage to or removal of silicon or titanium nitride ($TiN_x$), for example, $TiN_x$ comprised in a metal gate of an FET or $TiN_x$ comprised in a barrier between a semiconductor and a metal. The damage, for example, may involve dissolution (etching), conversion to different solid phases such as oxides, or a combination of both.

In a first aspect, a composition for stripping resist, specifically high dose implanted resist, from a microelectronic device comprising same is described. The composition for stripping resist comprises, consists of, or consists essentially of sulfuric acid and at least one phosphorus-containing acid, with the proviso that the phosphorus-containing acid cannot include phosphoric acid per se. In another embodiment, the composition for stripping resist comprises, consists of, or consists essentially of sulfuric acid and at least one phosphonic acid or phosphonic acid derivative. In still another embodiment, the composition for stripping resist comprises, consists of, or consists essentially of sulfuric acid, at least one phosphonic acid or phosphonic acid derivative, and at least one oxidizing agent, with the proviso that the at least one oxidizing agent cannot include hydrogen peroxide per se. In general, the specific proportions and amounts of components, in relation to each other, may be suitably varied to provide the desired removal action of the composition for the resist and/or processing equipment, as readily determinable within the skill of the art without undue effort.

Preferably, the sulfuric acid is concentrated sulfuric acid, which commercially is 95% to 98% $H_2SO_4$. The sulfuric acid may be present in the composition is in a range from about 50 wt % to about 99 wt %, based on the total weight of the composition, more preferably about 80 wt % to about 99 wt %.

The phosphorus-containing acid can include phosphonic acid, phosphonic acid derivatives, and phosphoric acid derivatives. Phosphonic acids and derivatives thereof include, but are not limited to, 1,5,9-triazacyclododecane-N,N',N"-tris(methylenephosphonic acid) (DOTRP), 1,4,7,10-tetraazacyclododecane-N,N',N",N"'-tetrakis(methylenephosphonic acid) (DOTP), nitrilotris(methylene) triphosphonic acid (i.e., Dequest 2000), diethylenetriaminepenta(methylenephosphonic acid) (DETAP), aminotri(methylenephosphonic acid), 1-hydroxyethylidene-1,1-diphosphonic acid (HEDP), bis(hexamethylene) triamine phosphonic acid, bis(hexamethylene triamine penta (methylenephosphonic acid)) (i.e., Dequest 2090), 1,4,7-triazacyclononane-N,N',N"-tris(methylenephosphonic acid (NOTP), N-(Phosphonomethyl)-iminodiacetic acid, 2-amino-2-propylphosphonic acid, iminobis(methylenephosphonic acid), pyridoxal-5-(dihydrogenphosphate), amino(phenyl)methylene-diphosphonic acid, ethylenebis (imino-(2-hydroxyphenyl)methylene(methyl)-phosphonic acid)), 2-Phosphonobutane-1,2,4-tricarboxylic acid, ethylenediamine tetra(methylene phosphonic acid) (EDTMPA), salts thereof, and combinations thereof. Phosphoric acid derivatives include, but are not limited to, esters of phosphoric acid such as phosphoric acid tributyl ester; phosphoric acid triethyl ester; phosphoric acid, tris(2-ethylhexyl) ester; phosphoric acid, monomethyl ester; Phosphoric acid, isotridecyl ester; phosphoric acid, 2-ethylhexyl diphenyl ester; and phosphoric acid triphenyl ester. Most preferably, the phosphorus-containing acid comprises Dequest 2000, Dequest 2090, or EDTMPA. The phosphorus-containing acid may be present in the composition in a range from about 1 wt % to about 50 wt %, based on the total weight of the composition, preferably about 1 wt % to about 20 wt %.

The at least one oxidizing agent can be added to assist with the removal of photoresist. Oxidizing agents contemplated include, but are not limited to, periodic acid, a periodate salt (e.g., ammonium periodate, tetramethylammonium periodate), ammonium persulfate, perchloric acid, a perchlorate salt (e.g., ammonium perchlorate, tetramethylammonium perchlorate), oxone ($2KHSO_5 \cdot KHSO_4 \cdot K_2SO_4$), ozone, a cerium (IV) salt or coordination complex, and combinations thereof. The salt of cerium (IV) may be, for example, cerium ammonium nitrate (CAN). The chemical formula for cerium ammonium nitrate may be expressed as $Ce(NH_4)_2(NO_3)_6$ or $(NH_4)_2Ce(NO_3)_6$. Other salts of cerium (IV) that may be used include, but are not limited to ceric nitrate, ceric ammonium sulfate, ceric sulfate, ceric bisulfate, ceric perchlorate, ceric methanesulfonate, ceric trifluoromethanesulfonate, ceric chloride, ceric hydroxide, ceric carboxylate, ceric β-diketone, ceric trifluoroacetate and ceric acetate. When present, the amount of oxidizing agent(s) in the composition is from about 0.1% to about 25% by weight, based on the total weight of the composition. Preferably, the at least one oxidizing agent comprises CAN.

The compositions of the first aspect are substantially devoid of added water and organic solvents. It is understood that concentrated $H_2SO_4$ has a small amount of water, however, preferably no additional water is added to the composition described herein. Accordingly, the compositions of the first aspect include less than about 5 wt % added water, more preferably less than 3 wt % added water, and most preferably less than 2 wt % added water, based on the total weight of the composition. As defined herein, "added water" corresponds to water that the manufacturer or the user of the composition of the first aspect intentionally adds to the components of said composition for dilution or other purposes. Water that is present in the commercially purchased components (e.g., concentrated $H_2SO_4$) is not considered "added water." Furthermore, the compositions of the first aspect are preferably substantially devoid of abrasive material, hydrogen peroxide, wetting agents (e.g., acetic acid, citric acid or another compound containing a carboxylic acid group), tungsten, fluoride ions, copper ions or copper-containing residue, and potassium sulfate.

The compositions of the first aspect have pH less than about 2, more preferably less than about 1. It is to be appreciated that the pH of the composition of the first aspect may be less than zero, depending on the components used and the amount thereof.

In another embodiment, the compositions of the first aspect further include bulk and hardened resist material, wherein the bulk and hardened resist material may comprise boron, arsenic, boron difluoride, indium, antimony, germanium, carbon and/or phosphorous ions. For example, the composition of the first aspect may include sulfuric acid, phosphonic acid or phosphonic acid derivative, and bulk and hardened resist material. In another embodiment, the composition of the second aspect may include sulfuric acid, at least one phosphorus-containing acid, and bulk and hardened resist material, with the proviso that the phosphorus-containing acid cannot include phosphoric acid per se. In yet another embodiment, the composition of the first aspect may include sulfuric acid, phosphonic acid or phosphonic acid derivative, at least one oxidizing agent, and bulk and hardened resist material, with the proviso that the at least one oxidizing agent cannot include hydrogen peroxide per se. The resist material and implantation ions may be dissolved and/or suspended in the composition of the first aspect.

The compositions of the first aspect are compatible with underlying silicon-containing materials and metal gate materials on the microelectronic device.

The compositions of the first aspect may be readily formulated as single-package formulations or multi-part formulations that are mixed at and/or before the point of use, e.g., the individual parts of the multi-part formulation may be mixed at the tool, in a storage tank upstream of the tool, or in a shipping package that delivers the mixed formulation directly to the tool. For example, a single shipping package may include at least two separate containers or bladders that may be mixed together by a user at the fab and the mixed formulation may be delivered directly to the tool. The shipping package and the internal containers or bladders of the package must be suitable for storing and shipping said composition components, for example, packaging provided by Advanced Technology Materials, Inc. (Danbury, Conn., USA).

Alternatively, a concentrate of the composition of the first aspect may be formulated and packaged in one container for shipping and for mixture with on-site components prior to and/or during use, wherein said method of use is described herein. For example, the concentrate can be formulated for the addition of sulfuric acid prior to and/or during use. When the composition include sulfuric acid, phosphonic acid or phosphonic acid derivative, and at least one oxidizing agent, with the proviso that the at least one oxidizing agent cannot include hydrogen peroxide per se, it is contemplated that the phosphonic acid (or phosphonic acid derivative) and at least one oxidizing agent be combined at the tool to extend the shelf life and the bath life of the formulation.

Another aspect relates to a kit including, in one or more containers, one or more components adapted to form the compositions of the first aspect, as described herein. The containers of the kit must be suitable for storing and shipping said compositions, for example, NOWPak® containers (Advanced Technology Materials, Inc., Danbury, Conn., USA). The one or more containers which contain the components of the compositions described herein preferably include means for bringing the components in said one or more containers in fluid communication for blending and dispense. For example, referring to the NOWPak® containers, gas pressure may be applied to the outside of a liner in said one or more containers to cause at least a portion of the contents of the liner to be discharged and hence enable fluid communication for blending and dispense. Alternatively, gas pressure may be applied to the head space of a conventional pressurizable container or a pump may be used to enable fluid communication. In addition, the system preferably includes a dispensing port for dispensing the blended composition to a process tool.

Substantially chemically inert, impurity-free, flexible and resilient polymeric film materials, such as PTFE or PTFA, are preferably used to fabricate the liners for said one or more containers. Desirable liner materials are processed without requiring co-extrusion or barrier layers, and without any pigments, UV inhibitors, or processing agents that may adversely affect the purity requirements for components to be disposed in the liner. A listing of desirable liner materials include films comprising virgin polytetrafluoroethylene (PTFE), PFA, Halar®, and so on. Preferred thicknesses of such liner materials are in a range from about 5 mils (0.005 inch) to about 30 mils (0.030 inch), as for example a thickness of 20 mils (0.020 inch).

Regarding the containers for the kits, the disclosures of the following patents and patent applications are hereby incorporated herein by reference in their respective entireties: U.S. Pat. No. 7,188,644 entitled "APPARATUS AND METHOD FOR MINIMIZING THE GENERATION OF PARTICLES IN ULTRAPURE LIQUIDS;" U.S. Pat. No. 6,698,619 entitled "RETURNABLE AND REUSABLE, BAG-IN-DRUM FLUID STORAGE AND DISPENSING CONTAINER SYSTEM;" International Application No. PCT/US08/63276 entitled "SYSTEMS AND METHODS FOR MATERIAL BLENDING AND DISTRIBUTION" filed on May 9, 2008 in the name of John E. Q. Hughes; and International Application No. PCT/US08/85826 entitled "SYSTEMS AND METHODS FOR DELIVERY OF FLUID-CONTAINING PROCESS MATERIAL COMBINATIONS" filed on Dec. 8, 2008 in the name of John E. Q. Hughes et al.

In a third aspect, the compositions described herein are usefully employed to clean bulk and hardened resist from the surface of the microelectronic device. The microelectronic device of the third aspect may be a wafer, for example, a semiconductor wafer, upon or within which electronic devices are formed. The microelectronic devices may comprise transistors, such as FETs, including FETs comprising a metal gate (e.g., a metal gate comprising $TiN_x$). Some of the microelectronic devices may be partially formed when the wafer is provided, for example, ion-implantation of source/drain regions or a channel region may have been done prior to providing the wafer. The resist may be adhered to the top surface of the wafer. The resist may have been ion-implanted (e.g., HDII) during ion-implantation of a portion of the wafer not covered by the resist. The ion-implantation of the resist may have caused a hardened, crusted, polymerized and/or carbonized outer layer to form in the resist. The compositions are formulated to preferentially not damage low-k dielectric materials or metal gate materials, e.g., $TiN_x$, on the device surface. Preferably the compositions described herein remove at least 85% of the bulk and hardened resist present on the device prior to resist removal, more preferably at least 90%, even more preferably at least 95%, and most preferably at least 99%.

In removal application, the compositions of the first aspect can be applied in any suitable manner to the microelectronic device having resist material thereon, e.g., by spraying the composition on the surface of the device, by dipping (in a volume of the composition) of the device including the resist material, by contacting the device with another material, e.g., a pad, or fibrous sorbent applicator element, that is saturated with the composition, by contacting the device including the resist material with a circulating composition, or by any other suitable means, manner or technique, by which the composition is brought into contact with the resist material on the microelectronic device. The application may be in a batch or single wafer apparatus, for dynamic or static cleaning.

In use of the compositions of the first aspect for removing bulk and hardened resist from microelectronic devices having same thereon, the compositions typically are contacted with the device for a time of from about 10 sec to about 60 minutes, at temperature in a range of from about 20° C. to about 200° C., preferably about 40° C. to about 100° C. Such contacting times and temperatures are illustrative, and any other suitable time and temperature conditions may be employed that are efficacious to at least partially clean the bulk and hardened resist from the device. "At least partially clean" and "substantial removal" both correspond to removal of at least 85% of the and hardened resist present on the device prior to resist removal, more preferably at least 90%, even more preferably at least 95%, and most preferred at least 99%.

In one embodiment of the third aspect, the composition of the first aspect is applied to the microelectronic device surface for removing bulk and hardened resist therefrom, followed by contact of the device surface with a cerium-containing composition. Thereafter, the device surface can be contacted again with the composition of the first aspect to effectuate the substantial removal of the bulk and hardened resist from the device surface. The process of exposing the device surface to the (a) composition of the first aspect, (b) cerium-containing composition, and (c) composition of the first aspect, in that order, has the advantage of substantially removing the bulk and hardened photoresist without damaging low-k dielectric materials or metal gate materials, e.g., $TiN_x$, on the device surface. The cerium-containing composition may comprise at least one salt or coordination complex of the element cerium. The salt of cerium may be, for example, cerium ammonium nitrate. The chemical formula for cerium ammonium nitrate may be expressed as $Ce(NH_4)_2(NO_3)_6$ or $(NH_4)_2Ce(NO_3)_6$. Cerium ammonium nitrate is also known as CAN, cerium (IV) ammonium nitrate, ceric ammonium nitrate and ammonium cerium nitrate. CAN, as used herein, refers to cerium ammonium nitrate. CAN is an orange, water-soluble salt that may be used as an oxidizing agent. Other salts of cerium that may be used include, but are not limited to ceric nitrate, ceric ammonium sulfate, ceric sulfate, ceric bisulfate, ceric perchlorate, ceric methanesulfonate, ceric trifluoromethanesulfonate, ceric chloride, ceric hydroxide, ceric carboxylate, ceric β-diketone, ceric trifluoroacetate and ceric acetate. In some embodiments of the invention, the solution may comprise more than one of the above salts of cerium. Preferably, the cerium salt comprises cerium ammonium nitrate. The effective range of concentrations for the cerium salt is from about 0.01% to about 70% by weight, preferably about 0.01% to about 30% by weight, based on the total weight of the solution.

It should be appreciated that other embodiments of the third aspect are contemplated including, but not limited to, (i) exposure to concentrated sulfuric acid, exposure to cerium-containing composition, exposure to the composition of the first aspect, (ii) exposure to the composition of the first aspect, exposure to cerium-containing composition, exposure to concentrated sulfuric acid, (iii) exposure to cerium-containing composition, exposure to the composition of the first aspect, (iv) exposure to the composition of the first aspect, exposure to cerium-containing composition; (v) exposure to the composition of the first aspect, exposure to cerium-containing composition, exposure to the composition of the first aspect, or (vi) exposure to just the composition of the first aspect. It is to be appreciated that the compositions may be used at various temperatures to complete the stripping process, as readily determined by the person skilled in the art.

Following the achievement of the desired removal action, the composition of the first aspect may be readily removed from the device to which it has previously been applied, as may be desired and efficacious in a given end use application of the compositions described herein. Preferably, the rinse solution comprises deionized water. Alternatively, the rinse process includes a water rinse followed by a SC-1 ($H_2O_2$—$NH_4OH$—$H_2O$) rinse, followed by a second rinse with DI water. During the rinse process, the SC-1 composition can be modified to include at least one phosphorus-containing acid described herein to further limit $TiN_x$ loss. It is to be appreciated that the rinse solutions may be used at various temperatures to complete the rinse process, as readily determined by the person skilled in the art. Thereafter, the device may be dried using nitrogen, isopropanol (IPA), or a spin-dry cycle.

Yet another aspect relates to the improved microelectronic devices made according to the methods described herein and to products containing such microelectronic devices.

Another aspect relates to a recycled composition, wherein the composition may be recycled until loading with components of the photoresist reaches the maximum amount the composition may accommodate, as readily determined by one skilled in the art. It should be appreciated by one skilled in the art that a filtration and/or pumping system may be needed for the recycling process.

A still further aspect relates to methods of manufacturing an article comprising a microelectronic device, said method comprising contacting the microelectronic device with a composition of the first aspect for sufficient time to clean bulk and hardened resist from the microelectronic device having said resist thereon, and incorporating said microelectronic device into said article, using a composition described herein.

Yet another aspect relates to the removal of high dose ion-implanted resist from the surface of a microelectronic device comprising same, said method comprising:

contacting the microelectronic device with a first composition for time and temperature necessary to effectuate at least partial removal of the resist, wherein the first composition comprises sulfuric acid and at least one phosphorus-containing acid, with the proviso that the phosphorus-containing acid cannot include phosphoric acid per se;

contacting the microelectronic device with a cerium-containing composition to effectuate additional removal of the resist;

contacting the microelectronic device with the first composition to complete the substantial remove the resist from the device.

The features and advantages of the invention are more fully shown by the illustrative examples discussed below.

Example 1

The following formulations were prepared and were used in a process described herein to remove bulk and hardened resist from a coupon.
Formulation A: 100% $H_2SO_4$ (96%)
Formulation B: 10% $H_3PO_4$ (86%), 90% $H_2SO_4$ (96%)
Formulation C: 20% $H_3PO_4$ (86%), 80% $H_2SO_4$ (96%)
Formulation D: 50% $H_3PO_4$ (86%), 50% $H_2SO_4$ (96%)
Formulation E: 3% Dequest 2000eg (50%), 97% $H_2SO_4$ (96%)
Formulation F: 10% Dequest 2000eg (50%), 90% $H_2SO_4$ (96%)
Formulation G: 4.6% Dequest 2090 (45%), 95.4% $H_2SO_4$ (96%)
Formulation H: 1.64% EDTMPA, 98.36% $H_2SO_4$ (96%)

The process included immersing a coupon comprising $TiN_x$ in each Formulation A-F for 29 minutes at 54° C., followed by immersion of the coupon in a cerium-containing composition for 60 minutes at 70° C., followed by re-immersion in the respective Formulation A-F for 20 minutes at 54° C. The coupons were analyzed for $TiN_x$ loss as well as $TiO_2$ loss using ellipsometric analysis, wherein a negative value indicates growth of the species. The results are shown in Table 1.

TABLE 1

| Formulation | $TiN_x$ loss/Å | $TiO_2$ loss/Å |
|---|---|---|
| A | 47.1 | −6.1 |
| B | 46.6 | −0.9 |
| C | 42.5 | −3.6 |
| D | 29.3 | 0.9 |
| E | 24.6 | −11.5 |
| F | 22.6 | −12.2 |
| G | 24.5 | −17.4 |
| H | 21.9 | −10 |

It can be seen that the formulations comprising Dequest 2000eg (E and F) were capable of reducing the $TiN_x$ etch rate in half relative to Formulation A, while replacing about half of the dissolved $TiN_x$ with oxide. Notably, the amount of Dequest 2000eg did not seem to affect the $TiN_x$ loss or oxide gain. Further, the formulations comprising Dequest 2090 and EDTMPA provided for the largest reduction of $TiN_x$ loss as well as the largest reduction in total $TiN_x$+$TiO_2$ loss.

The solutions were also used to remove photoresist and graded on a scale from 1 to 10 based on removal effectiveness. The method used was described herein wherein the coupon comprising the resist was immersed in the formulation, followed by immersion in a cerium-containing solution, followed by re-immersion in the formulation. Referring to the FIGURE, it can be seen that the formulations comprising Dequest 2000eg (i.e., formulations E and F), Dequest 2090 (Formulation G) and EDTMPA (Formulation H) all removed the photoresist more effectively than when Formulation A was used.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art, based on the disclosure herein. The invention therefore is to be broadly construed, as encompassing all such variations, modifications and alternative embodiments within the spirit and scope of the claims hereafter set forth.

What is claimed is:

1. A composition for stripping resist, said composition comprising sulfuric acid and at least one phosphorus-containing acid, with the proviso that the phosphorus-containing acid cannot include phosphoric acid per se, said composition having a pH less than about 2, wherein the composition is substantially devoid of organic solvents, and wherein at least one phosphorus-containing acid comprises a species selected from the group consisting of 1,5,9-triazacyclodo-decane-N,N',N''-tris(methylenephosphonic acid) (DOTRP), 1,4,7,10-tetraazacyclododecane-N,N',N'',N'''-tetrakis(methylenephosphonic acid) (DOTP), diethylenetriaminepenta (methylenephosphonic acid) (DETAP), aminotri(methylenephosphonic acid), bis(hexamethylene)triamine phosphonic acid, bis(hexamethylene triamine penta(methylenephosphonic acid)), 1,4,7-triazacyclononane-N,N',N''-tris(methylenephosphonic acid (NOTP), N-(Phosphonomethyl)-iminodiacetic acid, 2-amino-2-propylphosphonic acid, iminobis(methylenephosphonic acid), pyridoxal-5-(dihydrogenphosphate), amino(phenyl)methylenediphosphoric acid, ethylenebis(imino-(2-hydroxyphenyl)methylene(methyl)-phosphonic acid)), 2-Phosphonobutane-1,2,4-tricarboxylic acid, ethylenediamine tetra(methylene phosphonic acid) (EDTMPA), salts thereof, and combinations thereof.

2. The composition of claim 1, wherein the sulfuric acid is concentrated.

3. The composition of claim 1, wherein the amount of sulfuric acid is in a range from about 50 wt % to about 99 wt %, based on the total weight of the composition.

4. The composition of claim 1, wherein the amount of phosphorus-containing acid is in a range from about 1 wt % to about 50 wt %, based on the total weight of the composition.

5. The composition of claim 1, further comprising at least one oxidizing agent, with the proviso that the at least one oxidizing agent cannot include hydrogen peroxide per se.

6. The composition of claim 5, wherein the at least one oxidizing agent comprises a species selected from the group consisting of periodic acid, a periodate salt, ammonium persulfate, perchloric acid, ammonium perchlorate, tetramethylammonium perchlorate, oxone ($2KHSO_5 \cdot KHSO_4 \cdot K_2SO_4$), ozone, a cerium (IV) salt, a cerium (IV) coordination complex, and combinations thereof.

7. The composition of claim 6, wherein the cerium (IV) salt comprises a species selected from the group consisting of cerium ammonium nitrate (CAN), ceric nitrate, ceric ammonium sulfate, ceric sulfate, ceric bisulfate, ceric perchlorate, ceric methanesulfonate, ceric trifluoromethanesulfonate, ceric chloride, ceric hydroxide, ceric carboxylate, ceric β-diketone, ceric trifluoroacetate, ceric acetate, and combinations thereof.

8. The composition of claim 1, said composition being substantially devoid of at least one of added water, abrasive material, hydrogen peroxide, wetting agents, tungsten, fluoride ions, copper ions or copper-containing residue, and potassium sulfate.

9. A method of removing high dose ion-implanted resist from the surface of a microelectronic device comprising same, said method comprising contacting the microelectronic device with a first composition for time and temperature necessary to effectuate at least partial removal of the resist, said first composition comprising sulfuric acid and at least one phosphorus-containing acid, with the proviso that the phosphorus-containing acid cannot include phosphoric acid per se, and wherein the composition is substantially devoid of organic solvents.

10. The method of claim 9, further comprising contacting the microelectronic device with a cerium-containing composition to effectuate additional removal of the resist.

11. The method of claim 10, further comprising contacting the microelectronic device with the first composition to complete the substantial removal of resist from the device.

12. The method of claim 9, further comprising rinsing the device.

13. The method of claim 12, wherein the rinse comprises a water rinse followed by a SC-1 rinse, followed by a second rinse with DI water.

14. The method of claim 13, wherein the SC-1 rinse comprises hydrogen peroxide, ammonium hydroxide and water.

15. The method of claim 9, wherein the composition does not substantially damage low-k dielectric materials or metal gate materials on the device surface.

16. The method of claim 9, wherein the resist is implanted with a dopant species selected from the group consisting of boron, boron difluoride, arsenic, indium, gallium, germanium, bismuth, xenon, phosphorus and antimony.

17. The method of claim 9, wherein the composition is combined just prior to contacting with the surface of the microelectronic device.

18. The method of claim 9, wherein the pH of the composition is less than about 2.

19. The method of claim 9, wherein at least one phosphorus-containing acid comprises a species selected from the group consisting of 1,5,9-triazacyclododecane-N,N',N''-tris(methylenephosphonic acid) (DOTRP), 1,4,7,10-tetraazacyclododecane-N,N',N'',N'''-tetrakis(methylenephosphonic acid) (DOTP), diethylenetriaminepenta (methylenephosphonic acid) (DETAP), aminotri (methylenephosphonic acid), bis(hexamethylene)triamine phosphonic acid, bis(hexamethylene triamine penta(methylenephosphonic acid)), 1,4,7-triazacyclononane-N,N',N''-tris (methylenephosphonic acid (NOTP), N-(Phosphonomethyl)-iminodiacetic acid, 2-amino-2-propylphosphonic acid, iminobis(methylenephosphonic acid), pyridoxal-5-(dihydrogenphosphate), amino(phenyl)methylene-diphosphoric acid, ethylenebis(imino-(2-hydroxyphenyl)methylene(methyl)-phosphonic acid)), 2-Phosphonobutane-1,2,4-tricarboxylic acid, ethylenediamine tetra(methylene phosphonic acid) (EDTMPA), salts thereof, and combinations thereof.

* * * * *